(12) United States Patent
Deng et al.

(10) Patent No.: US 11,936,345 B2
(45) Date of Patent: Mar. 19, 2024

(54) IMPEDANCE ADJUSTMENT CIRCUIT AND METHOD, BIAS CIRCUIT STRUCTURE AND AMPLIFIER

(71) Applicant: SMARTER MICROELECTRONICS (GUANG ZHOU) CO., LTD., Guangzhou (CN)

(72) Inventors: Jinliang Deng, Guangzhou (CN); Ping Li, Guangzhou (CN)

(73) Assignee: SMARTER MICROELECTRONICS (GUANG ZHOU) CO., LTD., Guangzhou (CN)

(*) Notice: Subject to any disclaimer, the term of this patent is extended or adjusted under 35 U.S.C. 154(b) by 601 days.

(21) Appl. No.: 17/138,783

(22) Filed: Dec. 30, 2020

(65) Prior Publication Data
US 2021/0359648 A1 Nov. 18, 2021

Related U.S. Application Data

(63) Continuation of application No. PCT/CN2020/115993, filed on Sep. 17, 2020.

(30) Foreign Application Priority Data

May 13, 2020 (CN) .......................... 202010400876.0

(51) Int. Cl.
*H03F 1/56* (2006.01)
*H03K 19/00* (2006.01)

(52) U.S. Cl.
CPC ........... *H03F 1/56* (2013.01); *H03K 19/0005* (2013.01)

(58) Field of Classification Search
CPC .......... H03F 1/56; H03F 1/30; H03K 19/0005
USPC ................................................. 330/296, 285
See application file for complete search history.

(56) References Cited

U.S. PATENT DOCUMENTS 6,882,227 B2 * 4/2005 Barry .................... H03F 1/0261
330/296

* cited by examiner

*Primary Examiner* — Andrea Lindgren Baltzell
*Assistant Examiner* — Khiem D Nguyen
(74) *Attorney, Agent, or Firm* — Syncoda LLC; Feng Ma (57) ABSTRACT

An impedance adjustment circuit is connected in parallel with a bias current output end of a bias circuit. The bias circuit is configured to provide bias current to a first circuit unit. The impedance adjustment circuit is configured to adjust source impedance of the first circuit unit.

17 Claims, 3 Drawing Sheets

---
901 when the bias circuit provides bias current to a first circuit unit, adjusting, by the impedance adjustment circuit, source impedance of the first circuit unit

FIG. 9

IMPEDANCE ADJUSTMENT CIRCUIT AND METHOD, BIAS CIRCUIT STRUCTURE AND AMPLIFIER

CROSS-REFERENCE TO RELATED APPLICATIONS

This application is a continuation of International Application No. PCT/CN2020/115993 filed on Sep. 17, 2020, which claims priority to Chinese Patent Application No. 202010400876.0 filed on May 13, 2020. The disclosures of these applications are hereby incorporated by reference in their entirety.

BACKGROUND

In the related art, the memory effect of power amplifier is related to the input impedance and output impedance of the power amplification transistor of the power amplifier, and since the source impedance of the power amplification transistor is very large and has no adjustable freedom, the asymmetry phenomenon in the frequency of the intermodulation distortion of the output signal in the upper and lower sidebands turns to be severe, i.e., the memory effect of the power amplifier is strong, when a constant-amplitude dual-tone signal is input.

SUMMARY

The present disclosure relates generally to impedance adjustment technologies, and more specifically to an impedance adjustment circuit and method, a bias circuit structure and an amplifier.

Various embodiments of the disclosure provide an impedance adjustment circuit, connected in parallel with a bias current output end of a bias circuit; the bias circuit is configured to provide bias current to a first circuit unit; and the impedance adjustment circuit is configured to adjust source impedance of the first circuit unit.

The embodiments of the disclosure further provide a bias circuit structure, including a bias circuit and the impedance adjustment circuit of any one of the above-descriptions.

The embodiments of the disclosure further provide an amplifier, including the above-described bias circuit structure and a first circuit unit, the first circuit unit is connected with a bias current output end of the bias circuit, and the first circuit unit is configured to amplify signals.

The embodiments of the disclosure further provide an impedance adjustment method applied to an impedance adjustment circuit, the impedance adjustment circuit is connected in parallel with a bias current output end of a bias circuit;

The method including: when the bias circuit provides bias current to a first circuit unit, adjusting, by the impedance adjustment circuit, source impedance of the first circuit unit.

The embodiments of the disclosure provide an impedance adjustment circuit, connected in parallel with a bias current output end of a bias circuit; the bias circuit is configured to provide bias current to a first circuit unit; and the impedance adjustment circuit is configured to adjust source impedance of the first circuit unit. In this way, the adjustment of the source impedance of the first circuit unit may be realized by the impedance adjustment circuit, which is advantageous to improve the memory effect of an amplifier in the case that the impedance adjustment circuit is located in the amplifier.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with aspects related to the disclosure as recited in the appended claims.

Terms used in this application are only for the purpose of describing specific embodiments instead of limiting this application. The singular forms "a/an," "the" and "said" used in this application and the attached claims are intended to include the plural forms, unless the context clearly indicates otherwise. It should be understood that terms "and/or" used herein refers to and comprises any or all possible combinations of one or more of the associated listed items.

It should be understood that, although this application is possible to take the terms "first," "second" and "third," etc. may be used in the application to describe various information, the information should not be limited by these terms. These terms are only used to distinguish same type of information from each other. For example, without departing from the scope of this application, a first information may be referred to as a second information. Similarly, the second information may be referred to as the first information. Based on the context, for example, a word "if" used herein may be explained as "while/as" or "when" or "in response to determining".

The embodiments of the disclosure disclose an impedance adjustment circuit and method, a bias circuit structure and an amplifier, which may improve the memory effect of power amplifier applied to a wireless communication system, here, a power amplifier is a key device in wireless communication, and with the development of Long Term Evolution (LTE) and 5G NR in wireless communication, the linearity requirement of the power amplifier becomes higher and higher. In particular, for the 5th-Generation New Radio (5G NR), large bandwidth and high speed are the inevitable trends for 5G NR development. With the large bandwidth, the memory effect becomes a key technical difficulty which limits the linearity improvement of the power amplifier.

Figure 1:
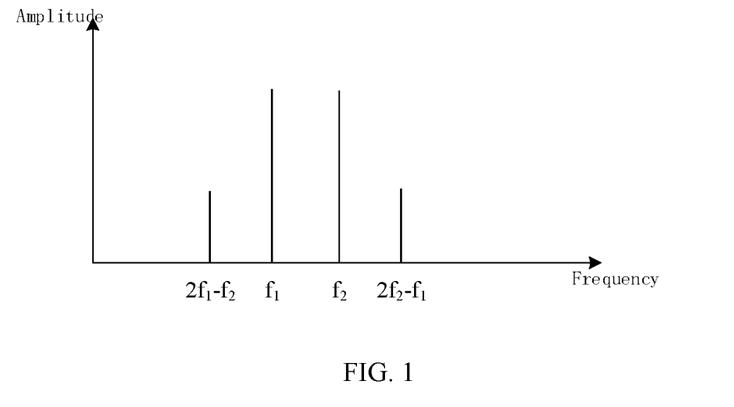
FIG. 1 is a schematic diagram of the distortion of Intermodulation 3 order (IM3) of the upper and lower sidebands of a system with no memory effect according to some embodiments.

FIG. 1 is a schematic diagram of the distortion of Intermodulation 3 order (IM3) of the upper and lower sidebands of a system with no memory effect according to some embodiments, as illustrated in FIG. 1, the horizontal axis represents frequency and the longitudinal axis represents signal amplitude, and it can be seen that in the system with no memory effect, two carrier signals with respective frequencies $f_1$ and $f_2$ have been subjected to intermodulation due to nonlinear factors, resulting in signals with symmetric IM3 at frequencies $2f_1-f_2$ and $2f_2-f_1$, respectively.

Figure 2:
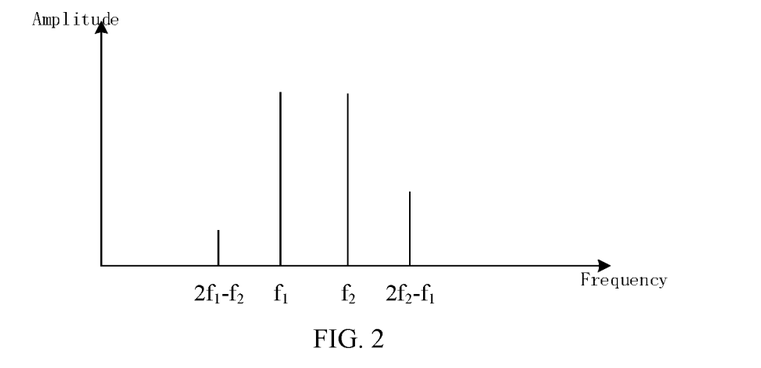
FIG. 2 is a schematic diagram of IM3 of the upper and lower sidebands of a system with memory effect according to some embodiments.

FIG. 2 is a schematic diagram of IM3 of the upper and lower sidebands of a system with memory effect in according to some embodiments, as illustrated in FIG. 2, the horizontal axis represents frequency and the longitudinal axis represents signal amplitude, and it can be seen that in the system with memory effect, two carrier signals with respective frequencies $f_1$ and $f_2$ have been subjected to intermodulation due to nonlinear factors, resulting in signals with asymmetric IM3 at frequencies $2f_1-f_2$ and $2f_2-f_1$, respectively. However, due to the asymmetry of the intermodulation distortion of the upper and lower sidebands, the up-and-down asymmetry of ACPR may occur, which may deteriorate the linear characteristics of the power amplifier. Here, the ACPR is the ratio of the average power of the adjacent frequency channel to the average power of the transmitting frequency channel.

Figure 3:
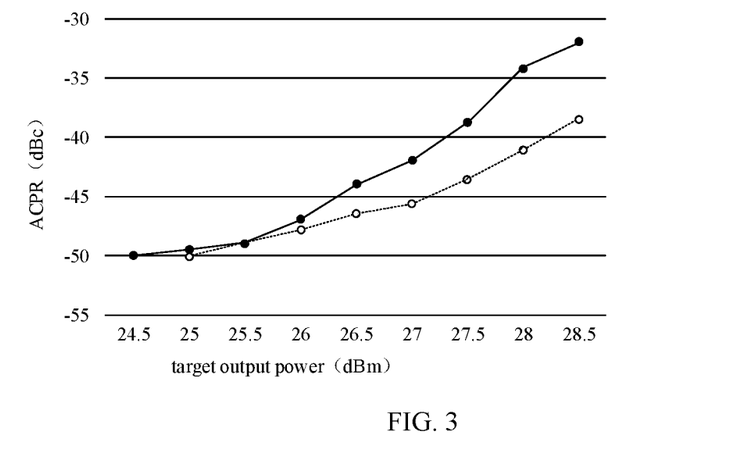
FIG. 3 is a schematic diagram of the up-and-down asymmetry of Adjacent Channel Power Ratio (ACPR) of the upper and lower sidebands of a system with memory effect according to some embodiments.

FIG. 3 is a schematic diagram of the up-and-down asymmetry of ACPR of the upper and lower sidebands of a system with memory effect in according to some embodiments, as illustrated in FIG. 3, the horizontal axis represents target output power and the longitudinal axis represents value of ACPR, here, the solid line represents the ACPR of the upper sideband of the system and the dashed line represents the ACPR of the lower sideband of the system, and it can be seen that the ACPRs of the upper and lower sidebands of the system do not overlap.

Figure 4:
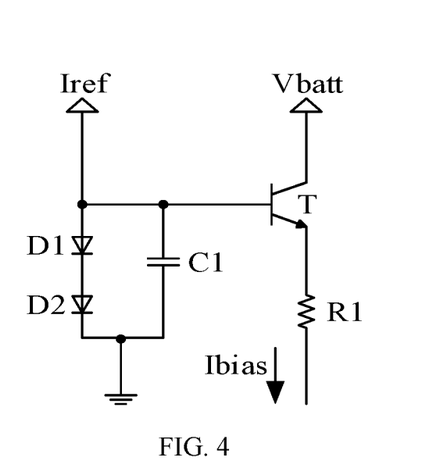
FIG. 4 is a schematic diagram of a bias circuit according to some embodiments.

FIG. 4 is a schematic diagram of a bias circuit according to some embodiments, as illustrated in FIG. 4, Iref represents a current source, and the first forward turn-on diode D1 and the second forward turn-on diode D2 are connected in series to form a diode serial branch, the serial diode branch and a first capacitor C1 are connected in parallel to form a branch connected between the current source Iref and the ground node; the base of the transistor T is connected with the common node of the first diode D1, the first capacitor C1 and the current source Iref, and the collector of the transistor T is connected with the voltage source Vbatt, and the emitter of the transistor T is connected with one end of a first resistor R1; and the first resistor R1 may be a DC ballast equivalent resistor; the current source Iref, the first diode D1, the second diode D2 and the capacitor C1 cooperate to provide the base clamp voltage of the transistor T, and the other end of the first resistor R1 provides bias current Ibias for a first circuit unit (not illustrated in FIG. 4), here, the first circuit unit may be a circuit amplification unit, and in some embodiments of the disclosure, the circuit amplification unit may be a power amplification transistor. Herein, as the baseband signal is a low-frequency signal, and for the baseband signal, the first capacitor C1 is equivalent to an open circuit, and observing following the direction from the first circuit unit to the bias current input end, the baseband signal is connected with the Base-Emitter (BE) junction of the transistor T after passing the first resistor R1, here, the current value of the bias current Ibias is relatively small, and the impedance value of the BE junction is relatively large, for example, the impedance value may be 100 ohms; after passing the BE junction, then passing the first diode D1 and the second diode D2 respectively to the ground, the path current of the first diode D1 and the second diode D2 is very small, therefore the series impedance of the first diode D1 and the second diode D2 is very large, and it can be seen that the source impedance of the first circuit unit in FIG. 4 is equivalent to the sum of the series impedance of the first resistor R1, the BE junction of the transistor T, the first diode D1 and the second diode D2, therefore, when the current value of the current source Iref corresponding to the value of Ibias is fixed, the current value of Ibias is fixed, and the value of current flowing through the BE junction of the transistor T is also fixed, and the path current of the first diode D1 and the second diode D2 is also fixed, and thus, the impedance value of the first resistor R1, the impedance value of the BE junction of the transistor T, and the sum of the series impedances of the first diode D1 and the second diode D2 are also fixed, so that the source impedance of the first circuit unit is not adjustable.

In view of the above technical problem that the input impedance is not adjustable, the following specific embodiments are proposed.

Figure 5:
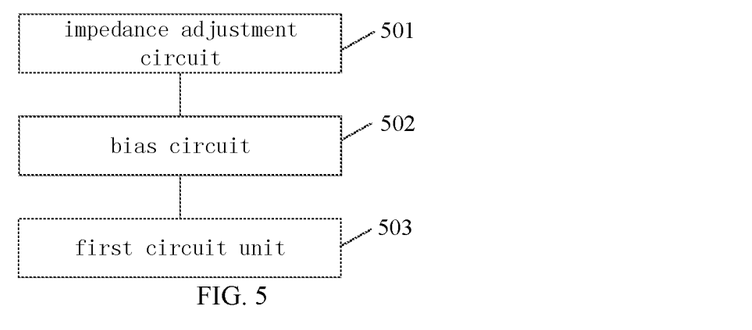
FIG. 5 is a schematic diagram of the connection of an impedance adjustment circuit, a bias circuit and a first circuit unit of an embodiment of the disclosure.

FIG. 5 is a schematic diagram of the connection of an impedance adjustment circuit, a bias circuit and a first circuit unit of an embodiment of the disclosure, as illustrated in FIG. 5, the impedance adjustment circuit 501 is connected in parallel with a bias current output end of a bias circuit 502; the bias circuit 502 is configured to provide bias current to a first circuit unit 503; and the impedance adjustment circuit 501 is configured to adjust source impedance of the first circuit unit 503.

Here, the bias circuit 502 may be the bias circuit illustrated in FIG. 4, and in some embodiments of the disclosure, the base of the transistor T is connected with the common node of the first diode D1, the first capacitor C1 and the current source Iref, so that the emitter junction of the transistor T is in a forward biased state; here, the transistor T may be an NPN-type transistor, and the collector of the transistor T is connected with the voltage source Vbatt, so that the collector junction of the transistor T is in a reverse biased state. As an embodiment, the first circuit unit may be a circuit unit that implements signal amplification, for example, the first circuit unit may be a power amplification transistor, of course, the first circuit unit herein may be a unit, other than the circuit unit, that implements signal amplification, and is not specifically limited herein.

It can be seen that the impedance adjustment circuit is connected in parallel with the bias current output end of the bias circuit, and the bias circuit is configured to provide bias current to the first circuit unit, and the impedance adjustment circuit is configured to adjust the input impedance of the first circuit unit. In this way, the adjustment of the source impedance of the first circuit unit may be realized by adjusting the impedance of the impedance adjustment circuit while keeping the bias current unchanged.

In some embodiments of the disclosure, the impedance adjustment circuit includes a first serial branch, and the first serial branch is formed by an inductor and a forward turn-on diode connected in series.

It may be understood that there is a frequency-selective characteristic of the inductor, and in some embodiments of the disclosure, the inductor is in a short-circuit state for the baseband signal, but in high-resistance state for high-frequency signals such as fundamental wave and harmonic, etc. Moreover, there is an impedance-adjustable characteristic of the forward turn-on diode, and the adjustment of the impedance of the diode may be realized by adjusting the current flowing through the diode. Therefore, the impedance of the diode may be adjusted by adjusting the amplitude of the current flowing through the diode of the first serial branch, thereby realizing the adjustment of the impedance of the impedance adjustment circuit, and thus, the adjustment of the source impedance of the first circuit unit may be realized by adjusting the impedance of the impedance adjustment circuit.

Figure 6:
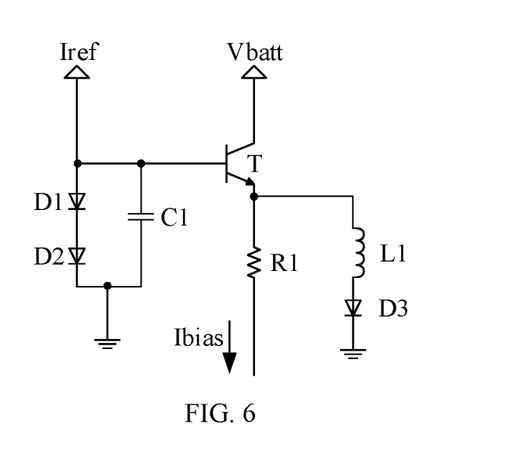
FIG. 6 is a first schematic diagram of the connection of an impedance adjustment circuit and a bias circuit of an embodiment of the disclosure.

FIG. 6 is a first schematic diagram of the connection of an impedance adjustment circuit and a bias circuit of an embodiment of the disclosure, as illustrated in FIG. 6, the impedance adjustment circuit 501 may include a first inductor L1 and a third forward turn-on diode D3, and the first inductor L1 and the third diode D3 are connected in series to form a first serial branch, and the first inductor L1 is connected with the emitter of the transistor T, and the cathode of the third diode D3 is grounded; the bias circuit structure in FIG. 6 is the same as the bias circuit structure illustrated in FIG. 4, and will not be repeated herein.

Since the first inductor L1 is in a short-circuit state for the baseband (low-frequency) signal, it forms a high resistance for high-frequency signals such as fundamental wave and harmonic, etc., and the impedance of the third diode D3 may be adjusted by adjusting the current flowing through the third diode D3, that is, due to the frequency-selective characteristic of the first inductor L1 and the impedance-adjustable characteristic of the third diode D3, the adjustment of the source impedance of the first circuit unit may be realized without affecting the impedances of the fundamental wave and harmonic. Since the impedance of the third diode D3 may become very small with the increase of the current flowing therethrough, the source impedance of the first circuit unit may be adjusted over a wide range to obtain the optimum source impedance of the first circuit unit.

In some embodiments of the disclosure, as illustrated in FIG. 6, the current flowing through the BE junction of the transistor T is increased based on the unchanged value of the bias current Ibias and the presence of the impedance adjustment circuit 501 formed by the first inductor L1 and the third diode D3 connected in series, that is, the impedance value of the BE junction of the transistor T may be decreased, for example, from the original 25 ohms to 20 ohms, but since the impedance values of the first diode D1 and the second diode D2 are relatively large, and the sum of the impedance values of the first diode D1 and the second diode D2 may be 500 ohms, the impedance value of a second impedance circuit corresponds to a smaller change, decreasing from 525 ohms to 520 ohms. However, since the impedance value of the parallel circuit is the same as the impedance value of the branch, with the smallest impedance, among the parallel branches, the impedance value of a first impedance circuit is close to the impedance value of the third diode D3, and the impedance value of the third diode D3 may be adjusted by adjusting the current value of the third diode D3, thereby realizing the adjustment of the source impedance of the first circuit unit 503. Here, the impedance adjustment circuit 501 is a serial branch formed by the first inductor L1 and the third diode D3 connected in series, and the first impedance circuit may be an impedance circuit formed by the impedance adjustment circuit 501 and the first resistor R1 connected in parallel; and the second impedance circuit may be an impedance circuit formed by the first diode D1, the second diode D2, and the BE junction of the transistor T connected in series.

In some embodiments of the disclosure, current of the diode is obtained by shunting current of an adjustable current source.

In some embodiments of the disclosure, the above current source Iref may be an adjustable current source, and the amplitude of the current value of the third diode D3 of the impedance adjustment circuit 501 corresponds to the amplitude of the current value of the current source Iref, and in some embodiments of the disclosure, the current value of the third diode D3 increases with the increase of the current value of the current source Iref in the case that the bias current Ibias is unchanged.

In some embodiments of the disclosure, the impedance adjustment circuit includes a second serial branch, and the second serial branch is formed by a resistor, an inductor, and a forward turn-on diode connected in series.

Here, the resistor may be a resistor with an adjustable impedance value.

Figure 7:
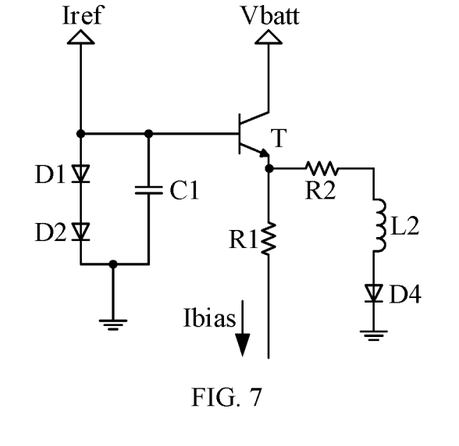
FIG. 7 is a second schematic diagram of the connection of an impedance adjustment circuit and a bias circuit of an embodiment of the disclosure.

FIG. 7 is a second schematic diagram of the connection of an impedance adjustment circuit and a bias circuit of an embodiment of the disclosure, as illustrated in FIG. 7, the impedance adjustment circuit 501 may include a second resistor R2, a second inductor L2, and a fourth forward turn-on diode D4, and the second resistor R2, the second inductor L2, and the fourth diode D4 are connected in series to form a second serial branch, and the second resistor R2 is connected with the emitter of the transistor T, and the cathode of the fourth diode D4 is grounded, herein, the second resistor R2 may be an adjustable resistor. The bias circuit structure in FIG. 7 is the same as the bias circuit structure illustrated in FIG. 4, and will not be repeated herein.

Since the second inductor L2 is in a short-circuit state for the baseband (low-frequency) signal, it forms a high resistance for high-frequency signals such as fundamental wave and harmonic, etc., and the impedance of the fourth diode D4 may be adjusted by adjusting the current flowing through the fourth diode D4, thereby realizing the adjustment of the impedance of the impedance adjustment circuit 501, and the adjustment of the impedance of the impedance adjustment circuit 501 may also be realized by the adjustment of the resistance of the second resistor R2. That is, due to the frequency-selective characteristic of the second inductor L2 and the impedance-adjustable characteristic of the fourth diode D4, the adjustment of the source impedance of the first circuit unit may be realized without affecting the impedances of the fundamental wave and harmonic. Furthermore, since the impedance of the fourth diode D4 may become very small with the increase of the current flowing therethrough, the source impedance of the first circuit unit may be adjusted over a wide range to obtain the optimum source impedance of the first circuit unit.

In some embodiments of the disclosure, as illustrated in FIG. 7, the current flowing through the BE junction of the transistor T is increased based on the unchanged value of the bias current Ibias and the presence of the impedance adjustment circuit 501 formed by the second resistor R2, the second inductor L2 and the fourth forward turn-on diode D4 connected in series, that is, the impedance value of the BE junction of the transistor T may be decreased, for example, from the original 25 ohms to 20 ohms, but since the impedance values of the first diode D1 and the second diode D2 are relatively large, and the sum of the impedance values of the first diode D1 and the second diode D2 may be 500 ohms, the impedance value of a third impedance circuit corresponds to a smaller change, decreasing from 525 ohms to 520 ohms. However, since the impedance value of the parallel circuit is the same as the impedance value of the branch, with the smallest impedance, among the parallel branches, the impedance value of a fourth impedance circuit is close to the sum of the impedance values of the fourth diode D4 and the second resistor R2, and the impedance value of the fourth diode D4 may be adjusted by adjusting the current value of the fourth diode D4, and/or the resistance of the second resistor R2 may be adjusted, thereby realizing the adjustment of the source impedance of the first circuit unit 503. Here, the first impedance adjustment circuit 501 is a serial branch formed by the second resistor R2, the second inductor L2 and the fourth forward turn-on diode D4 connected in series; the third impedance circuit may be the same as the second impedance circuit, that is, the third impedance circuit may be an impedance circuit formed by the first diode D1, the second diode D2, and the BE junction of the transistor T connected in series; and the fourth impedance circuit may be an impedance circuit formed by the first impedance adjustment circuit 501 and the first resistor R1 connected in parallel.

In some embodiments of the disclosure, current of the diode is obtained by shunting current of an adjustable current source.

In some embodiments of the disclosure, the above current source Iref may be an adjustable current source, and the amplitude of the current value of the fourth diode D4 of the impedance adjustment circuit 501 corresponds to the amplitude of the current value of the current source Iref, and in some embodiments of the disclosure, the current value of the fourth diode D4 increases with the increase of the current value of the current source Iref in the case that the bias current Ibias is unchanged.

In some embodiments of the disclosure, the impedance adjustment circuit includes a third serial branch, and the third serial branch is formed by a resistor, an L-C parallel branch, and a forward turn-on diode connected in series.

Here, the resistor may be a resistor with an adjustable impedance value.

Here, the L-C parallel branch is a circuit with an adjustable resonant frequency.

Figure 8:
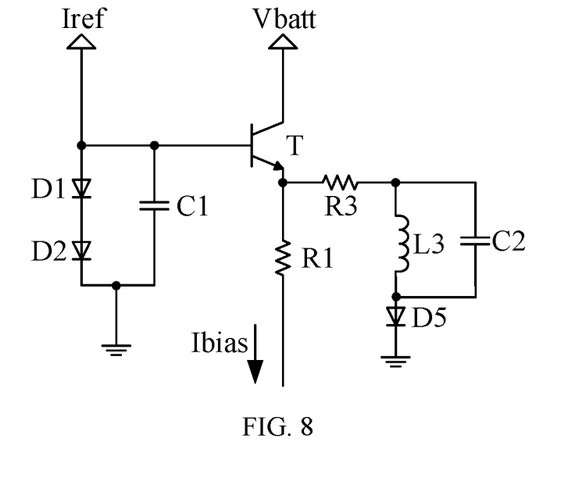
FIG. 8 is a third schematic diagram of the connection of an impedance adjustment circuit and a bias circuit of an embodiment of the disclosure.

FIG. 8 is a third schematic diagram of the connection of an impedance adjustment circuit and a bias circuit of an embodiment of the disclosure, as illustrated in FIG. 8, the impedance adjustment circuit 501 may include a third resistor R3, a third inductor L3, a second capacitor C2 and a fifth forward turn-on diode D5, and the third resistor R3 is connected with the emitter of the transistor T, the L3-C2 parallel branch formed by the third inductor L3 and the second capacitor C2 connected in parallel is connected between the third resistor R3 and the anode of the fifth diode D5, and the cathode of the fifth diode D5 is grounded, herein, the third resistor R3 may be an adjustable resistor. The bias circuit structure in FIG. 8 is the same as the bias circuit structure illustrated in FIG. 4, and will not be repeated herein.

Due to the band-stop and the frequency-selective characteristic of the L3-C2 parallel branch formed by the third inductor L3 and the second capacitor C2 connected in parallel, the different impedance characteristics may be realized for the baseband signal, fundamental wave signal and harmonic signal. In some embodiments of the disclosure, based on the impedance-adjustable characteristic of the fifth diode D5, the adjustable impedance value of the third resistor R3 and the resonant characteristic of the L3-C2 parallel branch, the impedance, at the baseband, fundamental wave and harmonic frequencies, of the entire impedance adjustment circuit 501 may be adjusted by adjusting the amplitude of the current of the fifth diode D5 and the impedance value of the third resistor R3 of the parallel branch as well as the resonant frequency of the L3-C2 parallel branch.

In some embodiments of the disclosure, as illustrated in FIG. 8, the current flowing through the BE junction of the transistor T of the second impedance circuit is increased based on the unchanged value of the bias current Ibias and the presence of the impedance adjustment circuit 501 formed by the third resistor R3, the L3-C2 parallel branch and the fifth diode D5 connected in series, that is, the impedance value of the BE junction of the transistor T may be decreased, for example, from the original 25 ohms to 20 ohms, but since the impedance values of the first diode D1 and the second diode D2 of the second impedance circuit are relatively large, and the sum of the impedance values of the first diode D1 and the second diode D2 may be 500 ohms, the impedance value of a fifth impedance circuit corresponds to a smaller change, decreasing from 525 ohms to 520 ohms. However, since the impedance value of the parallel circuit is the same as the impedance value of the branch, with the smallest impedance, among the parallel branches, the impedance value of a sixth impedance circuit is close to the sum of the impedance values of the impedance of the fifth diode D5, the impedance of the third resistor R3 and the resonant impedance of the L3-C2 parallel circuit, and the adjustment of the source impedance of the first circuit unit 503 may be realized by the adjustment of one of: the impedance value of the fifth diode D5, the resistance of the third resistor R3, and the resonant frequency of the L3-C2 parallel circuit. Here, the impedance adjustment circuit 501 is a serial branch formed by the third resistor R3, the L3-C2 parallel branch and the fifth diode D5 connected in series; the fifth impedance circuit may also be the same as the second impedance circuit, that is, the fifth impedance circuit may be an impedance circuit formed by the first diode D1, a second diode D2, and the BE junction of the transistor T connected in series; and the sixth impedance circuit may be an impedance circuit formed by the first impedance adjustment circuit 501 and the first resistor R1 connected in parallel.

In some embodiments of the disclosure, current of the diode is obtained by shunting current of an adjustable current source.

In some embodiments of the disclosure, the above current source Iref may be an adjustable current source, and the amplitude of the current value of the fifth diode D5 of the impedance adjustment circuit 501 corresponds to the amplitude of the current value of the current source Iref, and in some embodiments of the disclosure, the current value of the fifth diode D5 increases with the increase of the current value of the current source Iref in the case that the bias current Ibias is unchanged.

The embodiments of the disclosure further propose a bias circuit structure, including a bias circuit 502 and the above-described impedance adjustment circuit 501.

The embodiments of the disclosure further propose an amplifier, including the above-described bias circuit structure and a first circuit unit, the first circuit unit is connected with a bias current output end of the bias circuit, and the first circuit unit is configured to amplify signals.

Figure 9:
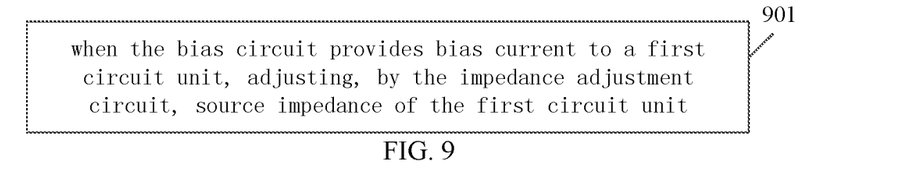
FIG. 9 is flowchart of an impedance adjustment method of an embodiment of the disclosure.

The embodiments of the disclosure further propose an impedance adjustment method applied to an impedance adjustment circuit, the impedance adjustment circuit is connected in parallel with a bias current output end of the bias circuit;

FIG. 9 is a flowchart of an impedance adjustment method of an embodiment of the disclosure, as illustrated in FIG. 9, the method may include:

In S901: when the bias circuit provides bias current to a first circuit unit, adjusting, by the impedance adjustment circuit, source impedance of the first circuit unit.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

What is claimed is:

1. An electronic circuit comprising:
a bias circuit; and
an impedance adjustment circuit, connected in parallel with a bias current output end of the bias circuit;
wherein
the bias circuit is configured to provide bias current to a first circuit unit; and
the impedance adjustment circuit is configured to adjust source impedance of the first circuit unit;
the electronic circuit further comprising a first serial branch, wherein the first serial branch comprises an inductor and a forward turn-on diode.

2. The electronic circuit of claim 1, wherein a current of the diode is obtained by shunting current of a current source.

3. An electronic circuit comprising:
a bias circuit; and
an impedance adjustment circuit, connected in parallel with a bias current output end of the bias circuit;
wherein
the bias circuit is configured to provide bias current to a first circuit unit; and
the impedance adjustment circuit is configured to adjust source impedance of the first circuit unit;
the electronic circuit further comprising a second serial branch, and the second serial branch comprises a resistor, an inductor, and a forward turn-on diode.

4. The electronic circuit of claim 3, wherein a current of the diode is obtained by shunting current of an adjustable current source.

5. The electronic circuit of claim 3, wherein the resistor is an adjustable resistor.

6. An electronic circuit comprising:
a bias circuit; and
an impedance adjustment circuit, connected in parallel with a bias current output end of the bias circuit;
wherein
the bias circuit is configured to provide bias current to a first circuit unit; and
the impedance adjustment circuit is configured to adjust source impedance of the first circuit unit;
the electronic circuit further comprising a third serial branch, and the third serial branch comprises a resistor, an L-C parallel branch, and a forward turn-on diode.

7. The electronic circuit of claim 6, wherein a current of the diode is obtained by shunting current of a current source.

8. The electronic circuit of claim 6, wherein the resistor is an adjustable resistor.

9. The electronic circuit of claim 6, wherein the L-C parallel branch is a circuit with an adjustable resonant frequency.

10. An amplifier comprising the electronic circuit of claim 1 and the first circuit unit, wherein the first circuit unit is connected with a bias current output end of the bias circuit, and the first circuit unit is configured to amplify signals.

11. An electronic apparatus comprising the amplifier of claim 10, wherein the impedance adjustment circuit is configured to adjust of the source impedance of the first circuit unit to thereby improve memory effect of the amplifier having the impedance adjustment circuit located therein.

12. The electronic apparatus of claim 11, further comprising a first serial branch, wherein the first serial branch comprises an inductor and a forward turn-on diode.

13. The electronic apparatus of claim 12, wherein a current of the diode is obtained by shunting current of a current source.

14. The electronic apparatus of claim 11, further comprising a second serial branch, and the second serial branch comprises a resistor, an inductor, and a forward turn-on diode.

15. The electronic apparatus of claim 14, wherein a current of the diode is obtained by shunting current of an adjustable current source.

16. The electronic apparatus of claim 14, wherein the resistor is an adjustable resistor.

17. The electronic apparatus of claim 11, further comprising a third serial branch, wherein
the third serial branch comprises a resistor, an L-C parallel branch, and a forward turn-on diode;
a current of the diode is obtained by shunting current of a current source;
the resistor is an adjustable resistor; and the L-C parallel branch is a circuit with an adjustable resonant frequency.

* * * * *